US 6,599,463 B2

(12) United States Patent
Miyazaki et al.

(10) Patent No.: US 6,599,463 B2
(45) Date of Patent: Jul. 29, 2003

(54) MONOLITHIC CERAMIC ELECTRONIC COMPONENT AND PRODUCTION PROCESS THEREFOR, AND CERAMIC PASTE AND PRODUCTION PROCESS THEREFOR

(75) Inventors: Makoto Miyazaki, Hirakata (JP); Satoru Tanaka, Moriyama (JP); Koji Kimura, Nishinomiya (JP); Koji Kato, Takefu (JP); Koji Suzuki, Moriyama (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 95 days.

(21) Appl. No.: 09/735,879

(22) Filed: Dec. 13, 2000

(65) Prior Publication Data

US 2001/0006451 A1 Jul. 5, 2001

(30) Foreign Application Priority Data

Dec. 13, 1999 (JP) .............................. 11-352635
Oct. 19, 2000 (JP) ........................ 2000-319522

(51) Int. Cl.$^7$ ............................................ C04B 35/634
(52) U.S. Cl. .................... 264/614; 156/89.12; 264/615; 264/616; 264/617; 264/618; 264/669; 264/670
(58) Field of Search ................................ 264/614, 615, 264/616, 617, 618, 669, 670; 156/89.12

(56) References Cited

U.S. PATENT DOCUMENTS

| | | | |
|---|---|---|---|
| 2,966,719 A | * 1/1961 | Park, Jr. ..................... 264/670 |
| 4,159,295 A | 6/1979 | Mazzuchelli et al. |
| 4,551,357 A | 11/1985 | Takeuchi |
| 4,649,125 A | 3/1987 | Takeuchi et al. |
| 5,362,693 A | 11/1994 | Chu et al. |
| 5,541,005 A | 7/1996 | Bezama et al. |
| 5,733,499 A | * 3/1998 | Takeuchi et al. ............. 264/669 |
| 5,759,480 A | 6/1998 | Hennings et al. |
| 6,157,285 A | * 12/2000 | Tokuda et al. ............... 336/200 |
| 6,274,080 B1 | * 8/2001 | Tang et al. .................. 264/669 |

FOREIGN PATENT DOCUMENTS

| | | | |
|---|---|---|---|
| EP | 0204261 A2 | 12/1986 | |
| EP | 0280819 A2 | 9/1988 | |
| EP | 0779257 A1 | 6/1997 | |
| EP | 0940825 A1 | 9/1999 | |
| GB | 1274211 | * 5/1972 | ................. 264/670 |
| JP | 9-106925 | 4/1997 | |
| KR | 1993-0011269 | 12/1993 | |

OTHER PUBLICATIONS

Machine Translation of Jp09–0106925,. Apr. 1997.*
European Search Report dated Apr. 26, 2002 in connection with Application No. GB 0125762.5.
European Search Report dated Apr. 26, 2002 in connection with Application No. GB 0125761.7.
Korean Office Action issued Sep. 28, 2002 (w/ English translation of relevant portion).

* cited by examiner

*Primary Examiner*—James Derrington
(74) *Attorney, Agent, or Firm*—Dickstein, Shapiro, Morin & Oshinsky, LLP.

(57) ABSTRACT

A process for producing a monolithic ceramic electronic component, which includes: providing a ceramic slurry, a conductive paste, and a ceramic paste; forming a plurality of composite structures each comprising a ceramic green sheet produced by shaping the ceramic slurry, internal circuit element films formed by applying the conductive paste partially onto a main surface of the ceramic green sheet so as to provide step-like sections, and a ceramic green layer which compensates for spaces defined by the step-like sections, the ceramic green layer being formed by applying the ceramic paste onto the region on the main surface of the sheet on which the element films are not formed, so as to substantially compensate for the spaces; forming a green laminate by laminating the composite structures; and firing the green laminate, wherein the ceramic paste contains ceramic powder, an organic solvent, and an organic binder. A monolithic ceramic electronic component produced through the process; a ceramic paste; and a production process for the ceramic paste are also disclosed.

21 Claims, 3 Drawing Sheets

MONOLITHIC CERAMIC ELECTRONIC COMPONENT AND PRODUCTION PROCESS THEREFOR, AND CERAMIC PASTE AND PRODUCTION PROCESS THEREFOR

BACKGROUND OF THE INVENTION

1. Field of the Invention

The present invention relates to a monolithic ceramic electronic component and a production process therefor, and to a ceramic paste and a production process therefor. More particularly, the present invention relates to a monolithic ceramic electronic component comprising internal circuit element films formed between ceramic sheets, and ceramic layers which compensate for spaces defined by step-like sections which are formed by the internal circuit element films, each ceramic layer being formed so as to have a pattern negative to that of the corresponding film, and a production process for the component; and to a ceramic paste which is advantageously employed for forming the ceramic layer, and a production process for the paste.

2. Background Art

When a monolithic ceramic electronic component, such as a monolithic ceramic capacitor, is produced, a plurality of ceramic green sheets are provided and the sheets are then laminated. In accordance with the intended function of the monolithic ceramic electronic component, an internal circuit element film, such as a conductive film or a resistive film, is formed on a specific ceramic green sheet, the film being an element of a capacitor, a resistor, an inductor, a varistor, a filter, etc.

In recent years, miniaturization and weight reduction of electronic devices such as mobile communication devices have been progressing. For example, when a monolithic ceramic electronic component is employed as a circuit element in such an electronic device, the size and the weight of the electronic component must be reduced. For instance, there has been increasing demand for a monolithic ceramic capacitor of small size and large capacitance.

A typical process for producing a monolithic ceramic capacitor is as follows. Dielectric ceramic powder, an organic binder, a plasticizer and an organic solvent are mixed together, so as to prepare a ceramic slurry. The resultant ceramic slurry is shaped into a sheet having a thickness of some tens of $\mu$m by means of a doctor-blade method or a similar method on a support, such as a polyester film, which is coated with a silicone resin serving as a peeling agent, to thereby form a ceramic green sheet, and the sheet is then dried.

Subsequently, onto a main surface of the ceramic green sheet, a conductive paste is applied through screen printing, so as to produce a plurality of patterns which are separated from one another. Thereafter, the resultant sheet is dried, to thereby form internal electrodes serving as internal circuit element films on the sheet. FIG. 1 is a plan view of a portion of a ceramic green sheet 2 on which internal electrodes 1 are formed so as to be distributed at a plurality of positions as described above.

Subsequently, the ceramic green sheet 2 is peeled off the support and cut into pieces of appropriate size. Thereafter, predetermined amounts of the pieces are laminated as partially shown in FIG. 2. Furthermore, predetermined amounts of ceramic green sheets not containing internal electrodes are laminated on opposite surfaces of the resultant laminate, to thereby form a green laminate 3.

The green laminate 3 is pressed in a vertical direction with respect to a horizontal plane, and then cut into laminate chips 4 as shown in FIG. 3, the chips being of appropriate size so as to be employed as individual monolithic ceramic capacitors. Subsequently, the binder is removed from each of the chips, the resultant chip is fired, and then external electrodes are formed on the chip, to thereby produce a monolithic ceramic capacitor.

In order to reduce the size of such a capacitor and increase the capacitance thereof, the ceramic green sheets 2 and the internal electrodes 1, which are laminated, must be increased in number, and the ceramic green sheets 2 must be thinned.

However, when the laminated sheets and electrodes are increased in number and the sheets are thinned, the internal electrodes 1 are accumulated. Consequently, difference in thickness becomes more apparent between a portion at which the electrodes 1 are provided and a portion at which the electrodes 1 are not provided; or a portion at which relatively large amounts of the internal electrodes 1 are provided in a vertical direction with respect to a horizontal plane and a portion at which small amounts of the electrodes 1 are provided in the vertical direction. Therefore, for example, as shown in FIG. 3, the appearance of the resultant laminate chip 4 is deformed such that a main surface of the chip assumes a convex shape.

When the laminate chip 4 is deformed as shown in FIG. 3, a relatively large strain arises during pressing at the portion at which the internal electrode 1 is not provided or the portion at which relatively small amounts of the electrodes 1 are provided in a vertical direction with respect to a horizontal plane. In addition, adhesion between the ceramic green sheets 2 is lowered, and a structural defect such as delamination or micro-cracking tends to occur, the defect being caused by internal stress of the chip during firing.

When the laminate chip 4 is deformed as shown in FIG. 3, the internal electrode 1 is undesirably deformed, which may cause a short circuit.

The aforementioned problems may lower the reliability of the resultant monolithic ceramic capacitor.

In order to solve the aforementioned problems, for example, Japanese Patent Application Laid-Open (kokai) Nos. 56-94719, 3-74820, and 9-106925 disclose a method in which a ceramic green layer 5 is formed on a region of a ceramic green sheet 2 on which internal electrodes 1 are not formed, as shown in FIG. 4, to thereby substantially compensate for spaces defined by step-like sections which are formed by the internal electrodes 1 on the ceramic green sheet 2.

In the case in which the ceramic green layer 5 which compensates for spaces defined by the step-like sections is formed, when a green laminate 3a is formed as partially shown in FIG. 5, there is no substantial difference in thickness between the portion at which the electrodes 1 are provided and the portion at which the electrodes are not provided; or between the portion at which relatively large amounts of the internal electrodes 1 are provided in a vertical direction with respect to a horizontal plane and the portion at which small amounts of the electrodes 1 are provided in the vertical direction. Therefore, as shown in FIG. 6, the resultant laminate chip 4a tends not to be undesirably deformed as shown in FIG. 3.

Consequently, the aforementioned structural defect such as delamination or micro cracking, or short circuit due to deformation of the internal electrode 1 tends not to occur, thereby enhancing the reliability of the resultant monolithic ceramic capacitor.

The aforementioned ceramic green layer 5 which compensates for spaces defined by the step-like sections has a composition similar to that of the ceramic green sheet 2, and the layer 5 is formed by applying a ceramic paste containing dielectric ceramic powder, an organic binder, a plasticizer and an organic solvent onto the green sheet 2. In order to form the layer 5 through printing at high accuracy so as to attain a thickness (e.g., 2 μm or less) which is equal to that of the internal electrode 1, the dispersibility of the ceramic powder in the ceramic paste must be high.

In connection with the foregoing, for example, Japanese Patent Application Laid-Open (kokai) No. 3-74820 discloses a method for preparing a ceramic paste in which ceramic powder is dispersed by use of a three-roll mill. However, it is difficult to increase dispersibility of the ceramic powder through use of a three-roll mill only.

Japanese Patent Application Laid-Open (kokai) No. 9-106925 discloses that a ceramic slurry for forming a ceramic green sheet 2 is prepared by mixing dielectric ceramic powder, an organic binder and a first organic solvent having a low boiling point, and the resultant slurry is employed for forming a ceramic green sheet 2; and that the slurry is mixed with a second organic solvent having a boiling point higher than that of the first organic solvent, and the resultant mixture is heated so as to remove only the first organic solvent from the mixture, to thereby prepare a ceramic paste for forming a ceramic green layer 5 which compensates for spaces defined by step-like sections.

When the ceramic paste is prepared through at least two mixing steps, the dispersibility of the ceramic powder is improved to some extent. However, since the slurry or paste contains the organic binder, the viscosity of the slurry or paste becomes high during mixing. This imposes a limitation on improving dispersibility of the ceramic powder when an apparatus such as a ball mill is employed.

As already mentioned, there is a requirement for high dispersibility of the ceramic powder contained in the ceramic paste employed for forming the ceramic green layer 5 which compensates for spaces defined by step-like sections, the layer being very thin and having a thickness equal to that of the internal electrode 1. When the thickness of the internal electrode 1 decreases, the ceramic powder must exhibit a correspondingly higher dispersibility.

Even when dispersibility of the ceramic powder is low in the ceramic green layer 5, the ceramic green sheet 2 provided on the layer 5 may compensate for such low dispersibility to some extent. However, when the thickness of the sheet 2 decreases, the sheet cannot fully compensate for such low dispersibility.

Therefore, as the development of a monolithic ceramic capacitor of small size and large capacitance has progressed, there has been a growing need for high dispersibility of the ceramic powder contained in the ceramic green layer 5 which compensates for spaces defined by step-like sections.

In order to enhance dispersibility of the ceramic powder in the ceramic paste during mixing, the viscosity of the paste may be decreased. However, when the amount of the aforementioned organic solvent of low boiling point is increased in order to decrease the viscosity of the paste, removal of the solvent following dispersion of the ceramic powder requires a prolonged period of time.

When a monolithic ceramic capacitor is produced by firing a green laminate 3a including three different elements, i.e., ceramic green sheets 2, internal electrodes 1 and ceramic green layers 5 which compensates for spaces defined by step-like sections which are formed by the electrodes, these three elements shrink during debinding and then firing. Consequently, stress due to differences in the physical properties of these three elements arises in the capacitor, and the stress may cause structural defects within the capacitor.

In the process disclosed in Japanese Patent Application Laid-Open (kokai) No. 9-106925, the organic binder contained in a ceramic paste for forming a ceramic green layer 5 which compensates for spaces defined by step-like sections is the same as that contained in a ceramic slurry for forming a ceramic green sheet 2. Briefly, the organic binders are dissolved in the same organic solvent. Therefore, when the ceramic green sheet 2 is laminated on the ceramic green layer 5 which has been dried, the organic binder contained in the dried layer 5 is dissolved with the organic solvent contained in the sheet 2, and thus the layer 5 may be impregnated with the organic solvent. In view of the above, the ceramic paste disclosed in Japanese Patent Application Laid-Open (kokai) No. 9-106925 is not necessarily suitable for a ceramic paste for a very thin ceramic layer such as the ceramic green layer 5 which compensates for spaces defined by step-like sections.

Hereinabove, problems to be solved are described with reference to a monolithic ceramic capacitor, but similar problems may be involved in other monolithic ceramic electronic components, such as a monolithic inductor.

SUMMARY OF THE INVENTION

In view of the foregoing, an object of the present invention is to provide a process for producing a monolithic ceramic electronic component which enables solution of the above-described problems; and a monolithic ceramic electronic component produced through the process.

Another object of the present invention is to provide a ceramic paste which is suitable for forming a very thin ceramic green layer such as the above-described ceramic layer which compensates for spaces defined by step-like sections; and a process for producing the paste.

Accordingly, the present invention provides a process for producing a monolithic ceramic electronic component. The process comprises the following steps.

Firstly, a ceramic slurry, a conductive paste and a ceramic paste are provided.

Subsequently, a plurality of composite structures are formed, each comprising a ceramic green sheet which is formed from the ceramic slurry; internal circuit element films which are formed by applying the conductive paste partially onto a main surface of the ceramic green sheet so as to provide step-like sections; and a ceramic green layer which compensates for spaces defined by the step-like sections, the ceramic green layer being formed by applying the ceramic paste to the region on the main surface of the ceramic green sheet on which the element films are not formed, so as to substantially compensate for the spaces.

Subsequently, the composite structures are laminated, to thereby form a green laminate. Then, the green laminate is fired.

The process for producing a monolithic ceramic electronic component comprises the above essential steps, wherein the ceramic paste for forming the ceramic green layer which compensates for step-like sections comprises ceramic powder, an organic solvent, and an organic binder. A characteristic feature of the process of the present invention resides in the organic binder contained in the ceramic paste.

That is, the organic binder is a mixture formed by physically mixing two different organic binders, such as a mixture of polyvinyl butyral and a cellulose ester, a mixture of a polyacrylate and a cellulose ester, a mixture of polyvinyl butyral and polyvinyl acetate, or a mixture of polyvinyl butyral and a polyacrylate; or a copolymer predominantly comprising an alkyl acrylate and/or an alkyl methacrylate.

When the aforementioned copolymer predominantly comprising an alkyl acrylate and/or an alkyl methacrylate is employed as the organic binder, the copolymer may contain, as a copolymerization element, a reactive monomer having a carboxyl group, an alkylene oxide group $(RO)_n$, a hydroxyl group, a glycidyl group, an amino group or an amido group.

Preferably, the ceramic paste comprising the organic binder is produced through the following steps.

The production process for the ceramic paste comprises a first dispersion step in which a first mixture containing ceramic powder and a first organic solvent undergoes processing for providing a primary dispersion; and a second dispersion step in which a second mixture containing an organic binder and the first mixture which has undergone the first dispersion step undergoes processing for providing a secondary dispersion. It should be noted that the organic binder is added during the second dispersion step. In addition to the first organic solvent, a second organic solvent having a relative evaporation rate lower than that of the first organic solvent is employed. The second organic solvent may be added during the first dispersion step or the second dispersion step. Alternatively, the second organic solvent may be added during the first dispersion step, and further added during the second dispersion step. After completion of the second dispersion step, the second mixture is heated, to thereby selectively remove the first organic solvent from the mixture.

In the present invention, the ceramic slurry for forming the ceramic green sheet preferably contains ceramic powder which has a composition substantially the same as that of the ceramic powder contained in the ceramic paste for forming the ceramic green layer which compensates for spaces defined by step-like sections.

Preferably, a dielectric ceramic powder is contained in the ceramic slurry and ceramic paste. In this case, when internal circuit element films are internal electrodes which are arranged so as to provide capacitance therebetween, a monolithic ceramic capacitor can be produced.

Preferably, a magnetic ceramic powder is contained in the ceramic slurry and ceramic paste. In this case, when internal circuit element films are formed as hook-shaped conductive films, a monolithic inductor can be produced.

The present invention also provides a monolithic ceramic electronic component produced through the above-described production process.

The present invention also provides a ceramic paste as described above, and a process for producing the paste.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with accompanying drawings, in which.

DETAILED DESCRIPTION OF PREFERRED EMBODIMENTS

One embodiment of the present invention will next be described by taking a production process for a monolithic ceramic capacitor as an example. The production process will be described with reference to FIGS. 4 through 6.

In order to carry out the embodiment, there are provided a ceramic slurry for forming a ceramic green sheet 2; a conductive paste for forming internal electrodes 1; and a ceramic paste for forming a ceramic green layer 5 which compensates for spaces defined by step-like sections formed by the electrodes 1.

The ceramic slurry is prepared by mixing dielectric ceramic powder, an organic binder, a plasticizer and an organic solvent having a relatively low boiling point. The ceramic slurry is shaped into a sheet, by means of a doctor blade process or a similar process, on a support such as a polyester film (not shown in the Figs.) which is coated with a resin such as a silicone resin serving as a release or peeling agent, to thereby obtain the ceramic green sheet 2. Subsequently, the resultant sheet is dried. The thickness of the ceramic green sheet 2 is some μm after drying.

On a main surface of the ceramic green sheet 2, the internal electrodes 1 are formed so as to be distributed at a plurality of positions. The thickness of each of the electrodes is about 1 μm after firing. The internal electrodes 1 are formed, for example, by applying the conductive paste onto the ceramic green sheet 2 through screen printing, and then drying the paste. Each of the electrodes 1 has a predetermined thickness, and thus spaces defined by step-like sections formed by the electrodes 1 are provided on the ceramic green sheet 2.

Subsequently, the ceramic green layer 5 is formed on the region on the main surface of the ceramic green sheet 2 on which the internal electrodes 1 are not formed, so as to substantially compensate for the spaces defined by the step-like sections. The ceramic green layer 5 is formed by applying the ceramic paste onto the ceramic green sheet 2 through screen printing, so as to have a pattern negative to that of the internal electrodes 1, and then the resultant layer 5 is dried. A characteristic feature of the present invention resides in the ceramic paste which is employed for forming the layer 5, and the paste will be described below in more detail.

In the above description, the ceramic green layer 5 is formed after the internal electrodes 1 are formed. However, the ceramic green layer 5 may be formed before the internal electrodes 1 are formed.

Figure 4:
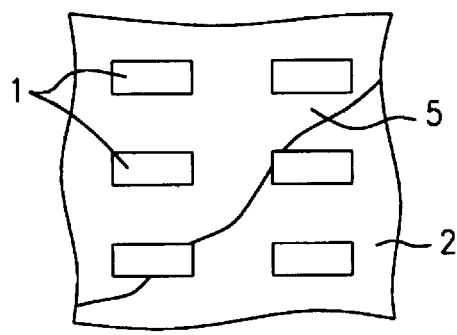
FIG. 4 is a plan view of a portion of a composite structure 6 which is produced through a production process for a monolithic ceramic capacitor as shown in FIG. 5.

A plurality of composite structures 6 are prepared. Each of the structures 6 as shown in FIG. 4 includes the ceramic green sheet 2, the internal electrodes 1 and the ceramic green layer 5, the electrodes and the layer being formed on the sheet as described above. Each of the composite structures 6 is peeled off the support, and then cut into pieces of appropriate size. Predetermined amounts of the pieces are laminated to form a lamination product, and then ceramic green sheets not containing such internal electrodes and ceramic green layers are laminated on opposite surfaces of the product, to thereby form a green laminate 3a as partially shown in FIG. 5.

Figure 6:
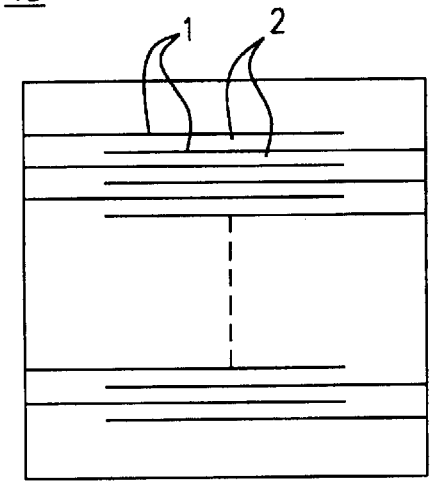
FIG. 6 is a schematic cross-sectional view of a laminate chip 4a which is produced through a production process for a monolithic ceramic capacitor as shown in FIG. 5.

The green laminate 3a is pressed in a vertical direction with respect to a horizontal plane, and then, as shown in FIG. 6, cut into appropriately-sized laminate chips 4a such that each of the chips can be suitably employed for producing a monolithic ceramic capacitor. Subsequently, the binder is removed from the laminate chip, and the resultant chip is fired. Thereafter, external electrodes are formed on the chip, to thereby produce a monolithic ceramic capacitor.

Figure 1:
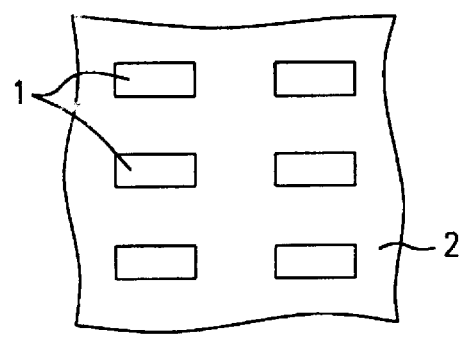
FIG. 1 is a plan view of a portion of a ceramic green sheet 2 on which internal electrodes 1 are formed through a production process for a monolithic ceramic capacitor as shown in FIG. 2.
Figure 2:
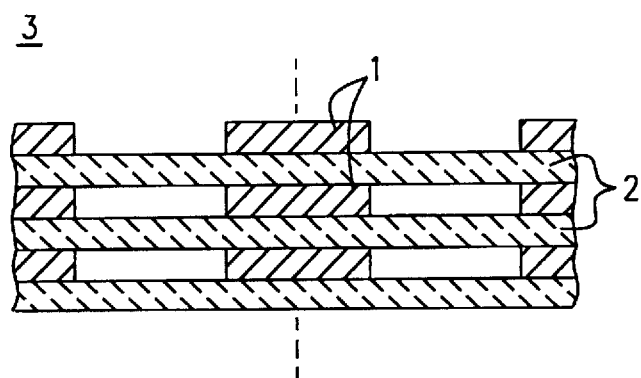
FIG. 2 is a schematic cross-sectional view of a portion of a green laminate 3, illustrating a process for producing a conventional monolithic ceramic capacitor of interest.
Figure 3:
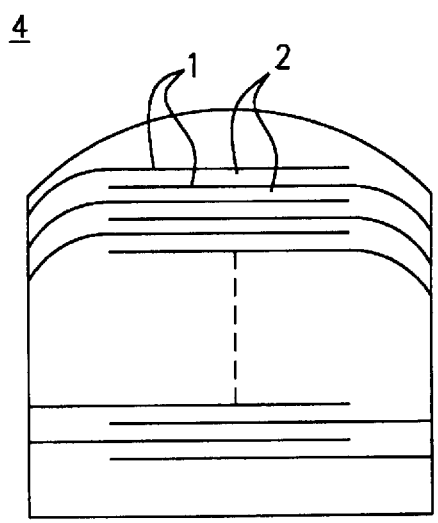
FIG. 3 is a schematic cross-sectional view of a laminate chip 4 which is produced through a production process for a monolithic ceramic capacitor as shown in FIG. 2.
Figure 5:
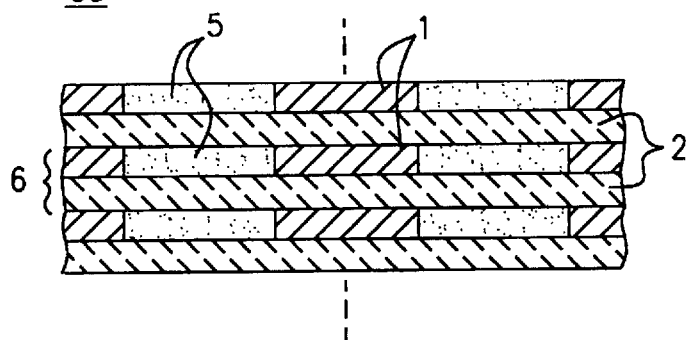
FIG. 5 is a schematic cross-sectional view of a portion of a green laminate 3a, illustrating a process for producing a monolithic ceramic capacitor of interest, which is an embodiment of the present invention.

When the ceramic green layer 5 is formed in the green laminate 3a as partially shown in FIG. 5, there is no substantial difference in thickness between the portion at which the electrodes 1 are provided and the portion at which the electrodes 1 are not provided; or between the portion at which relatively large numbers of the internal electrodes 1 are provided in a vertical direction with respect to a horizontal plane and the portion at which small numbers of the electrodes are provided in a vertical direction with respect to a horizontal plane. Therefore, as shown in FIG. 6, the laminate chip 4a tends not to be undesirably deformed as it is in FIG. 3. Consequently, structural defects such as delamination or micro cracking, or short-circuiting may not occur in the resultant monolithic ceramic capacitor.

A characteristic feature of the present invention resides in the organic binder contained in the ceramic paste for forming the ceramic green layer 5. Examples of the organic binder which may be employed include a mixture formed by physically mixing two different organic binders, such as a mixture of polyvinyl butyral and a cellulose ester, a mixture of a polyacrylate and a cellulose ester, a mixture of polyvinyl butyral and polyvinyl acetate, or a mixture of polyvinyl butyral and a polyacrylate; and a copolymer predominantly containing an alkyl acrylate and/or an alkyl methacrylate.

The amount of the organic binder is about 1–20 wt. % on the basis of the entirety of the ceramic powder, and preferably about 3–10 wt. %.

The aforementioned polyvinyl butyral, which is contained in a mixture serving as the organic binder, is produced through condensation between polyvinyl alcohol and butyraldehyde. Polyvinyl butyral products include a low polymerization product, a medium polymerization product and a high polymerization product, in which the amounts of acetyl groups and butyral groups are about 6 mol % or less and about 62–82 mol %, respectively. The polyvinyl butyral product contained in a mixture serving as the organic binder in the ceramic paste of the present invention is preferably a medium polymerization product in which the amount of a butyral group is about 65 mol %, in consideration of the viscosity of the polyvinyl butyral in an organic solution and the toughness of the film which is produced through drying of the polyvinyl butyral.

Examples of the cellulose ester which may be employed include nitrocellulose, cellulose acetate and ethyl cellulose.

Examples of the polyacrylate which may be employed include a polymer of a single (meth)acrylate monomer, such as acrylate or methyl acrylate; and a copolymer of two or more (meth)acrylate monomers.

The polyvinyl acetate which is employed may have an arbitrary molecular weight.

The mixing ratio of the cellulose ester and the polyvinyl butyral may be determined arbitrarily. When the ratio of the cellulose ester to the polyvinyl butyral is high, screen printing is easily carried out. In contrast, in the case in which the ratio of the polyvinyl butyral to the cellulose ester is high, when the ceramic green sheets 2 containing the ceramic green layer 5 are laminated and then pressed, the sheet 2 and the layer 5 are brought into tight contact with each other. In order to obtain the respective advantages of these two organic binders, the mixing ratio of the cellulose ester to the polyvinyl butyral is preferably about 10 wt. %/90 wt. % to 90 wt. %/10 wt. %.

The mixing ratio of the polyacrylate and the cellulose ester may also be determined arbitrarily. When the ratio of the polyacrylate to the cellulose ester is high, thermal decomposability of the binder is also high. In addition, when the ceramic green sheets 2 containing the ceramic green layer 5 are laminated and then pressed, the sheet 2 and the layer 5 are brought into tight contact with each other. In contrast, when the ratio of the cellulose ester to the polyacrylate is high, screen printing is easily carried out. In order to obtain the respective advantages of these two organic binders, the mixing ratio of the polyacrylate to the cellulose ester is preferably about 10 wt. %/90 wt. % to 90 wt. %/10 wt. %.

The mixing ratio of the polyvinyl butyral and the polyvinyl acetate may also be determined arbitrarily. When the ratio of the polyvinyl butyral to the polyvinyl acetate is high, the sheet 2 and the layer 5 are brought into tight contact with each other. In contrast, when the ratio of the polyvinyl acetate to the polyvinyl butyral is high, screen printing is easily carried out and thermal decomposability of the binder is high. In order to obtain the respective advantages of these two organic binders, the mixing ratio of the polyvinyl butyral to the polyvinyl acetate is preferably about 10 wt. %/90 wt. % to 90 wt. %/10 wt. %.

The mixing ratio of the polyvinyl butyral and the polyacrylate may also be determined arbitrarily. When the ratio of one of these two organic binders is high, the sheet and the layer 5 are brought into tight contact with each other. In order to obtain the respective advantages of these two organic binders, the mixing ratio of the polyvinyl butyral to the polyacrylate is preferably about 10 wt. %/90 wt. % to 90 wt. %/10 wt. %.

When a copolymer predominantly containing an alkyl acrylate and/or an alkyl methacrylate is employed as the organic binder, the alkyl (meth)acrylate preferably has a C1–C8 alkyl group. Examples of such alkyl (meth)acrylates include methyl acrylate, methyl methacrylate, ethyl acrylate, ethyl methacrylate, isopropyl acrylate, isopropyl methacrylate, n-butyl acrylate, n-butyl methacrylate, isobutyl acrylate, isobutyl methacrylate, t-butyl acrylate, t-butyl methacrylate, cyclohexyl acrylate, cyclohexyl methacrylate, 2-ethylhexyl acrylate and 2-ethylhexyl methacrylate.

When the aforementioned copolymer predominantly containing an alkyl acrylate and/or an alkyl methacrylate is employed as the organic binder, the copolymer preferably contains, as a copolymerization element, a reactive monomer containing a carboxyl group, an alkylene oxide group $(RO)_n$, a hydroxyl group, a glycidyl group, an amino group or an amido group.

Examples of the aforementioned carboxyl group-containing monomer include unsaturated carboxylic acids such as acrylic acid and methacrylic acid; and unsaturated bifunctional carboxylic acids such as maleic acid, itaconic acid and fumaric acid, and the half esters thereof. The carboxyl group-containing monomer is not particularly limited to the above examples and may be a mixture of two or more species, but the monomer is preferably methacrylic acid or acrylic acid which has the simplest structure.

The alkylene oxide $(RO)_n$ contained in an alkyl group of the alkyl (meth)acrylate is preferably industrially useful methylene oxide, ethylene oxide or propylene oxide. The alkylene oxide is preferably an alkylene oxide in which n is 1–40. This is because when n is in excess of 40, the molecular weight of the copolymer increases, and the solubility of the copolymer in an organic solvent drastically decreases.

Examples of the alkyl (meth)acrylate in which an alkyl group contains a hydroxyl group include 2-hydroxyethyl acrylate, 2-hydroxyethyl methacrylate, 2-hydroxybutyl acrylate and 2-hydroxybutyl methacrylate. When the number of carbon atoms of the alkyl group increases, the glass transition temperature of the copolymer decreases. Of these examples, 2-hydroxyethyl acrylate or 2-hydroxyethyl methacrylate is preferably employed, since characteristics are well balanced.

Examples of the alkyl (meth)acrylate in which an alkyl group contains a glycidyl group include glycidyl acrylate and glycidyl methacrylate.

Examples of the alkyl (meth)acrylate in which an alkyl group contains an amino or amido group include dimethylaminoethyl acrylate, dimethylaminoethyl methacrylate, diethylaminoethyl acrylate, diethylaminoethyl methacrylate, acrylamide, N-methylolacrylamide and diacetonacrylamide.

Examples of other copolymerizable reactive monomers include acrylonitrile, styrene, ethylene, vinyl acetate and n-vinylpyrrolidone.

No particular limitation is imposed on the amount of the aforementioned reactive monomer containing a carboxyl group, an alkylene oxide group $(RO)_n$, a hydroxyl group, a glycidyl group, an amino group or an amido group in the copolymer, but the amount is preferably about 0.1–50 mol %.

When the amount of the reactive monomer increases within the above range, hydrophilicity is imparted to the copolymer and the solubility of the copolymer in an organic solvent varies, and thus the viscosity of the ceramic paste containing the copolymer can be varied. However, when the amount of the reactive monomer excessively increases in the copolymer, the copolymer may fail to be completely dissolved in an organic solvent.

The aforementioned reactive monomers may be incorporated into the alkyl (meth)acrylate singly or in combination of two or more species.

The average molecular weight of the copolymer predominantly containing the alkyl (meth)acrylate is preferably about 1,000–300,000, and more preferably about 10,000–100,000. This is because when the molecular weight is less than about 1,000, the coagulation properties of the organic binder are weakened and the strength of the binder is lowered, whereas when the molecular weight is in excess of about 300,000, the viscosity of the copolymer solution increases and the paste containing the copolymer is difficult to prepare.

The copolymer predominantly containing the alkyl (meth)acrylate can be produced through, for example, the following process.

Toluene (300 g) is placed into a 1-liter separable flask equipped with a stirrer, a thermometer, a reflux condenser, a dropping funnel and a nitrogen gas-introducing tube. The toluene is heated at 90° C. under flow of nitrogen gas, a base material (150 g) and a polymerization initiator such as benzoyl peroxide (0.5 g) are placed into the dropping funnel, and then the resultant mixture is added dropwise through the funnel to the toluene over two hours. After completion of addition, the resultant reaction mixture is further heated at the reflux temperature for one hour, and then cooled, to thereby produce a copolymer predominantly containing the alkyl (meth)acrylate.

In the present invention, the ceramic paste for forming the ceramic green layer 5, the paste containing the organic binder having the aforementioned features, is preferably produced through the following process.

In order to produce the ceramic paste, there are carried out a first dispersion step in which a first mixture containing ceramic powder and a first organic solvent is subjected to processing for providing a primary dispersion; and a second dispersion step in which a second mixture containing an organic binder and the first mixture which has been subjected to the first dispersion step is subjected to processing for providing a secondary dispersion.

In the first dispersion step, an organic binder is not added, and thus the first mixture can be subjected to processing for providing a primary dispersion at low viscosity. Therefore, dispersibility of the ceramic powder is easily enhanced. In the first dispersion step, air adsorbed on the ceramic powder is replaced by the first organic solvent and thus the ceramic powder is sufficiently wetted with the first organic solvent, and the agglomerated ceramic powder is finely divided into particles as well.

In the second dispersion step, the organic binder can be mixed sufficiently and uniformly while dispersibility of the ceramic powder is maintained at a high level, the dispersibility being enhanced in the first dispersion step as described above. In addition, the ceramic powder may further be pulverized in the second dispersion step.

In the preferred production process, in addition to the first organic solvent, a second organic solvent having a relative evaporation rate lower than that of the first organic solvent is employed. The second organic solvent may be added during the first dispersion step or the second dispersion step. Alternatively, the second organic solvent may be added during the first dispersion step, and then an additional amount added during the second dispersion step.

After completion of the second dispersion step, the second mixture is heated to thereby selectively remove the first organic solvent from the mixture.

As described above, the first organic solvent is removed after completion of the second dispersion step, and thus the viscosity of the second mixture can be maintained at a relatively low level during the second dispersion step. Therefore, dispersibility can be maintained at a relatively high level, and the solubility of the organic binder, which is added during the second dispersion step as described above, can be enhanced.

The ceramic paste produced as described above substantially contains only the second organic solvent, although a trace amount of the first organic solvent may exist in the paste. Since the second organic solvent has a relative evaporation rate lower than that of the first organic solvent, the rate of drying of the ceramic paste can be reduced to a predetermined value or less. Therefore, the paste can be subjected to screen printing without any problem.

In the first and second dispersion steps of the aforementioned preferred production process, the customary apparatus such as a ball mill is employed for carrying out processing for providing a dispersion.

In the production process, a variety of organic solvents may be employed as the first or second organic solvent. Therefore, an appropriate organic solvent may be chosen for each of the first and second organic solvents in consideration of the relative evaporation rate of the organic solvent.

Examples of such organic solvents include ketones such as methyl ethyl ketone, methyl isobutyl ketone, diisopropyl ketone, isophorone and acetone; hydrocarbons such as toluene, benzene, xylene and n-hexane; alcohols such as methanol, ethanol, isopropanol, butanol and amyl alcohol; esters such as ethyl acetate, butyl acetate and isobutyl acetate; esters, hydrocarbons, and alcohols, such as ethyl cellosolve, butyl cellosolve, cellosolve acetate, methyl cellosolve acetate, butyl carbitol, cyclohexanol, dihydroterpineol, terpineol, dipropylene glycol and dimethyl phthalate; pine oil; chlorinated hydrocarbons such as methylene chloride; and mixtures thereof.

In order to readily remove the first organic solvent after completion of the second dispersion step, the solvent preferably has a relative evaporation rate of about 100 or more at 20° C., more preferably about 150 or more. As used herein, the term "relative evaporation rate" refers to an evaporation rate (time for a given weight to evaporate) relative to the evaporation rate of n-butyl acetate (boiling point: 126.5° C.) when the evaporation rate thereof is defined as 100.

Examples of organic solvents having a relative evaporation rate of about 100 or more, which are suitable for the first organic solvent, include methyl ethyl ketone (relative evaporation rate: 465), methyl isobutyl ketone (relative evaporation rate: 145), acetone (relative evaporation rate: 720), toluene (relative evaporation rate: 195), benzene (relative evaporation rate: 500), methanol (relative evaporation rate: 370), ethanol (relative evaporation rate: 203), isopropanol (relative evaporation rate: 205), ethyl acetate (relative evaporation rate: 525), isobutyl acetate (relative evaporation rate: 152), butyl acetate (relative evaporation rate: 100) and mixtures thereof.

Meanwhile, the second organic solvent preferably has a relative evaporation rate of about 50 or less at 20° C., in order to allow efficient screen printing.

Examples of organic solvents having a relative evaporation rate of about 50 or less, which are suitable for the second organic solvent, include diisopropyl ketone (relative evaporation rate: 49), methyl cellosolve acetate (relative evaporation rate: 40), cellosolve acetate (relative evaporation rate: 24), butyl cellosolve (relative evaporation rate: 10), cyclohexanol (relative evaporation rate: 10 or less), pine oil (relative evaporation rate: 10 or less), dihydroterpineol (relative evaporation rate: 10 or less), isophorone (relative evaporation rate: 10 or less), terpineol (relative evaporation rate: 10 or less), dipropylene glycol (relative evaporation rate: 10 or less), dimethyl phthalate (relative evaporation rate: 10 or less), butyl carbitol (relative evaporation rate: 40 or less), and mixtures thereof.

The first or second organic solvent may be readily chosen on the basis of its boiling point instead of its relative evaporation rate as described above. In many cases, when the first and second organic solvents are chosen such that the boiling point of the former is lower than that of the latter, the relative evaporation rate of the former is higher than that of the latter.

Boiling points of some of the aforementioned organic solvents are as follows: methyl ethyl ketone (79.6° C.), methyl isobutyl ketone (118.0° C.), acetone (56.1° C.), toluene (111.0° C.), benzene (79.6° C.), methanol (64.5° C.), ethanol (78.5° C.), isopropanol (82.5° C.), ethyl acetate (77.1° C.), isobutyl acetate (118.3° C.), diisopropyl ketone (143.5° C.), methyl cellosolve acetate (143° C.), cellosolve acetate (156.2° C.), butyl cellosolve (170.6° C.), cyclohexanol (160° C.), pine oil (195–225° C.), dihydroterpineol (210° C.), isophorone (215.2° C.), terpineol (219.0° C.), dipropylene glycol (231.8° C.), and dimethyl phthalate (282.4° C.). The first and second organic solvents may be chosen on the basis of such boiling points.

When the first and second organic solvents are chosen on the basis of the difference in the boiling points, the difference between the boiling point of the first organic solvent and that of the second organic solvent is preferably about 50 degrees or more. This is because when the difference is about 50 degrees or more, the first organic solvent can be selectively and easily removed through heating after completion of the second dispersion step.

In order to facilitate screen printing, the second organic solvent preferably has a boiling point of about 150° C. or higher, more preferably about 200–250° C. When the boiling point is lower than about 150° C., the ceramic paste dries rapidly and thus the printing pattern meshes tend to be undesirably filled with the paste, whereas when the boiling point is higher than about 250° C., the printed film is difficult to dry and thus a prolonged period of time is necessary for drying.

The ceramic powder contained in the ceramic paste preferably has a composition substantially the same as that of the ceramic powder contained in the ceramic slurry for forming the ceramic green sheet 2. This is because when these ceramic powders have substantially the same composition, the ceramic green layer 5 and the ceramic green sheet 2 can be uniformly sintered.

When the ceramic powders have substantially the same composition, the powders contain the same primary component. For example, even when the powders contain different secondary components such as metallic oxide and glass in trace amounts, the powders are considered to have substantially the same composition. When the ceramic powder contained in the ceramic green sheet 2 satisfies temperature characteristics of capacitance, i.e., the B characteristic specified by JIS and the X7R characteristic specified by EIA, if the ceramic powder contained in the ceramic paste for forming the ceramic green layer 5 has the same primary component and satisfies the B and X7R characteristics, these powders are allowed to have different secondary components.

Figure 7:
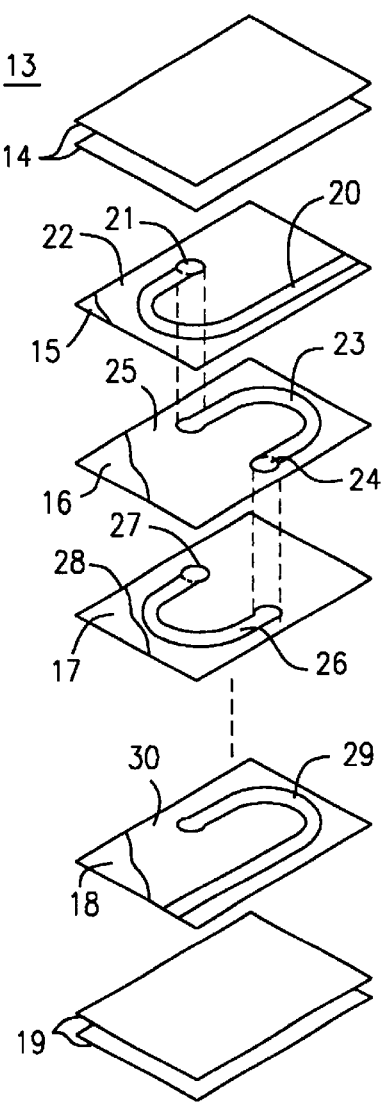
FIG. 7 is an exploded perspective view of elements constituting a green laminate 13 for producing a monolithic inductor, which is another embodiment of the present invention.
Figure 8:
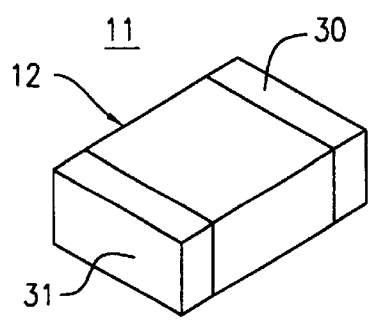
FIG. 8 is a perspective view of the appearance of a monolithic inductor 11 containing a laminate chip 12 which is produced by firing the green laminate 13 shown in FIG. 7.

FIG. 7 illustrates the production process for a monolithic inductor which is another embodiment of the present invention. FIG. 8 is a perspective view of the appearance of a monolithic inductor 11 produced through the production process. FIG. 7 is an exploded perspective view of elements constituting a green laminate 13 for producing a laminated chip 12 contained in the monolithic inductor 11.

The green laminate 13 contains a plurality of ceramic green sheets 14, 15, 16, 17, 18 and 19, and is produced by laminating the sheets 14 through 19.

The ceramic green sheets 14 through 19 are produced by shaping a ceramic slurry containing magnetic ceramic powder into sheets by means of the doctor blade process or a similar process, and then drying the resultant sheets. A characteristic feature of the present invention resides in the paste containing magnetic ceramic powder. Each of the ceramic green sheets 14 through 19 has a thickness, for example, of 10–30 mm after drying.

On each of the sheets 15 through 18, which are located in the middle portion of the laminate 13, a hook-shaped conductive film and a ceramic green layer are formed which compensates for spaces defined by step-like sections formed by the film. A process for the formation of the film and the layer are described below.

Firstly, a hook-shaped conductive film 20 is formed on the ceramic green sheet 15. The film 20 is formed such that a first end of the film extends to the edge of the sheet 15. A via hole conductor 21 is formed at a second end of the film 20.

A hole which is to be filled with the conductor 21 is formed in the sheet 15 by means of a laser or punching. Subsequently, the conductive paste is applied onto the sheet 15 through screen printing, and then the resultant sheet is dried, to thereby form the hook-shaped conductive film 20 and the via hole conductor 21.

A ceramic green layer 22 is formed on the region on the main surface of the ceramic green sheet 15 on which the hook-shaped conductive film 20 is not formed, so as to substantially compensate for spaces defined by the step-like sections formed by the film 20. The ceramic green layer 22 is formed by applying the ceramic paste onto the sheet 15 through screen printing, and then drying the resultant sheet.

Subsequently, on the ceramic green sheet 16, a hook-shaped conductive film 23, a via hole conductor 24 and a ceramic green layer 25 which compensates for spaces defined by step-like sections formed by the film 23 are formed in a manner similar to that described above. A first end of the film 23 is connected to the second end of the film 20 with the intervention of the via hole conductor 21. The via hole conductor 24 is formed at a second end of the film 23.

Subsequently, on the ceramic green sheet 17, a hook-shaped conductive film 26, a via hole conductor 27 and a ceramic green layer 28 which compensates for spaces defined by step-like sections formed by the film 26 are formed in a manner similar to that described above. A first end of the film 26 is connected to the second end of the film 23 with the intervention of the via hole conductor 24. The via hole conductor 27 is formed at a second end of the film 26.

If necessary, the above-described lamination of the ceramic green sheets 16 and 17 is carried out repeatedly.

Subsequently, on the ceramic green sheet 18, a hook-shaped conductive film 29 and a ceramic green layer 30 which compensates for spaces defined by step-like sections formed by the film 29 are formed. A first end of the film 29 is connected to the second end of the film 26 with the intervention of the via hole conductor 27. The film 29 is formed such that a second end thereof extends to the edge of the sheet 18.

Each of the hook-shaped conductive films 20, 23, 26 and 29 has a thickness of about 30 $\mu$m after drying.

In the green laminate 13, which is produced through the lamination of a plurality of composite structures including the ceramic green sheets 14 through 19, the hook-shaped conductive films 20, 23, 26 and 29 are successively connected to one another with the intervention of the via hole conductors 21, 24 and 27 to thereby form a coil-shaped conductor having a plurality of turns.

The laminate chip 12 which constitutes the monolithic inductor 11 shown in FIG. 8 is produced by firing the green laminate 13. The green laminate 13 shown in FIG. 7 is employed for producing only one laminate chip 12. However, a green laminate for producing a plurality of laminate chips may be formed. In this case, after the green laminate is formed, the laminate is cut into pieces to thereby produce a plurality of laminate chips.

Subsequently, as shown in FIG. 8, external electrodes 30 and 31 are formed on the opposite ends of the laminate chip 12, such that the electrodes 30 and 31 are connected to the first end of the film 20 and the second end of the film 29, respectively, to thereby produce the monolithic inductor 11.

Ceramic powder is contained in the ceramic green sheet 2 and the ceramic green layer 5 which constitute the monolithic ceramic capacitor which is described above with reference to FIGS. 4 through 6; and the ceramic powder is also contained in the ceramic green sheets 14 through 19 and the ceramic green layers 22, 25, 28 and 30 which constitute the monolithic inductor 11 which is described above with reference to FIGS. 7 and 8. Examples of the ceramic powder include ceramic powder of an oxide such as alumina, zirconia, magnesia, titanium oxide, barium titanate, lead titanate zirconate or ferrite-manganese; and ceramic powder of a non-oxide such as silicon carbide, silicon nitride, or sialon. The ceramic powder which is employed is preferably pulverized and has a spherical shape. The mean particle size of the powder is preferably about 5 $\mu$m or less, more preferably about 1 $\mu$m.

When barium titanate containing an alkali metal oxide as an impurity in an amount of about 0.1 wt. % or less is employed as the ceramic powder, a trace amount of the following metallic oxide or glass component may be incorporated into the ceramic powder.

Examples of the metallic oxide include terbium oxide, dysprosium oxide, holmium oxide erbium oxide, ytterbium oxide, manganese oxide, cobalt oxide, nickel oxide, and magnesium oxide.

Examples of the glass component include $Li_2$—(SiTi)$O_2$—MO (wherein MO refers to $Al_2O_3$ or $ZrO_2$), $SiO_2$—$TiO_2$—MO (wherein MO refers to BaO, CaO, SrO, MgO, ZnO or MnO), $Li_2O$—$B_2O_3$—(SiTi)$O_2$+MO (wherein MO refers to $Al_2O_3$ or $ZrO_2$), $B_2O_3$—$Al_2O_3$—MO (wherein MO refers to BaO, CaO, SrO or MgO), and $SiO_2$.

A conductive paste is employed for forming the internal electrodes 1 which constitute the monolithic ceramic capacitor which is described above with reference to FIGS. 4 through 6; and the conductive paste is also employed for forming the hook-shaped conductive films 20, 23, 26 and 29 and the via hole conductors 21, 24 and 27 which constitute the monolithic inductor 11 which is described above with reference to FIGS. 7 and 8. The conductive paste employed will next be described.

The conductive paste employed in the monolithic ceramic capacitor includes copper powder, nickel powder or conductive powder containing an alloy of Ag/Pd having a ratio of about 60 wt. %/40 wt. % to 10 wt. %/90 wt. %. Such powder has a mean particle size of about 0.02–3 $\mu$m, preferably 0.05–0.5 $\mu$m. The powder (100 parts by weight); an organic binder (about 2–20 parts by weight, preferably about 5–10 parts by weight); a resinate of a metal such as Ag, Au, Pt, Ti, Si, Ni or Cu, serving as a sintering-suppressing agent (about 0.1–3 parts by weight, preferably about 0.5–1 parts by weight, as reduced to metal); and an organic solvent (about 35 parts by weight) are kneaded by use of a three-roll mill, and then the same or a different organic solvent is further added to the resultant mixture to control the viscosity, to thereby prepare the conductive paste.

The conductive paste employed in the monolithic inductor 11 includes conductive powder containing Ag or an alloy of Ag/Pd having a ratio of about 80 wt. %/20 wt. % to 100 wt. %/0 wt. %. The powder (100 parts by weight); and the organic binder, the sintering-suppressing agent and the organic solvent, which are the same as those employed in the above conductive paste, are kneaded at the same proportions as described above by use of a three-roll mill, and then the same or a different organic solvent is further added to the resultant mixture to control the viscosity, to thereby prepare the conductive paste.

EXAMPLES

The present invention will next be described in more detail by way of Test Examples.

Test Example 1

Test Example 1 relates to a monolithic ceramic capacitor. In Test Example 1, when a ceramic paste for forming a ceramic green layer which compensates for spaces defined by step-like sections was prepared, an organic binder employed in the paste was formed by physically mixing two different organic binders, i.e., a mixture of polyvinyl butyral and a cellulose ester, a mixture of a polyacrylate and a cellulose ester, a mixture of polyvinyl butyral and polyvinyl acetate, or a mixture of polyvinyl butyral and a polyacrylate. In Test Example 1, the effect of such a mixture of two different organic binders was confirmed.

1. Preparation of Ceramic Powder

Firstly, barium carbonate ($BaCO_3$) and titanium oxide ($TiO_2$) were weighed so as to attain a mol ratio of 1:1, and wet-mixed by use of a ball mill, and the resultant mixture was dehydrated and then dried. Subsequently the dried mixture was calcined at 1,000° C. for two hours, and then pulverized to thereby obtain a dielectric ceramic powder.

2. Preparation of Ceramic Slurry and Formation of Ceramic Green Sheet

The thus-prepared ceramic powder (100 parts by weight), polyvinyl butyral (medium polymerization product) (7 parts by weight), dioctyl phthalate (DOP) serving as a plasticizer (3 parts by weight), methyl ethyl ketone (30 parts by weight), ethanol (20 parts by weight), toluene (20 parts by weight) and zirconia grinding balls having a diameter of 1 mm (600 parts by weight) were placed in a ball mill, and wet-mixed for 20 hours to thereby prepare a ceramic slurry.

The resultant ceramic slurry was shaped into a ceramic green sheet having a thickness of 3 $\mu$gm (2 $\mu$m after firing) by means of the doctor blade process. The sheet was dried at 80° C. for five minutes.

3. Preparation of Conductive Paste

Metallic powder (Ag/Pd=70/30) (100 parts by weight), ethyl cellulose (4 parts by weight), alkyd resin (2 parts by weight), Ag metallic resinate (3 parts by weight, 17.5 parts by weight as reduced to Ag) and butyl carbitol acetate (35 parts by weight) were kneaded by use of a three-roll mill, and then terpineol (35 parts by weight) was added to the resultant mixture to control the viscosity of the mixture.

4. Preparation of Ceramic Paste for Forming a Ceramic Green Layer Which Compensates for Spaces Defined by Step-like Sections (1) Working Examples 1 through 19

The above-prepared dielectric powder (100 parts by weight), methyl ethyl ketone having a relative evaporation rate of 465 (70 parts by weight) and zirconia grinding balls having a diameter of 1 mm (600 parts by weight) were placed in a ball mill, and wet-mixed for 16 hours. Subsequently, terpineol having a boiling point of 220° C. and a relative evaporation rate of 10 or less (40 parts by weight) and an organic binder (10 parts by weight) were added to the ball mill, and the resultant mixture was further mixed for 16 hours to thereby obtain a ceramic slurry mixture.

Polyvinyl butyral, a cellulose ester, a polyacrylate, or polyvinyl acetate were provided as the above-described organic binder. Specifically, the polyvinyl butyral employed was a medium polymerization product containing a butyral group and an acetyl group in an amount of 70 mol % and 5 mol %, respectively. The cellulose ester employed was ethyl cellulose containing an ethoxy group in an amount of 49%. The polyacrylate employed was a polymer predominantly containing isobutyl methacrylate and having a molecular weight of 50,000.

Mixtures of two different organic binders which were mixed at the ratios (by wt. %) shown in Table 1 were employed in Working Examples 1 through 19.

Subsequently, the above-obtained ceramic slurry mixture was subjected to reduced-pressure distillation in a hot bath at 60° C. by use of an evaporator for two hours. Through distillation, methyl ethyl ketone was completely removed from the slurry to thereby obtain a ceramic paste.

(2) Comparative Example 1

The above-prepared dielectric powder (100 parts by weight), terpineol having a boiling point of 220° C. (40 parts by weight) and a cellulose ester (ethyl cellulose resin) (5 parts by weight) were mixed in an automatic mortar. The cellulose ester shown in Table 1 was employed alone as the organic binder. The resultant mixture was kneaded by use of a three-roll mill to thereby obtain a ceramic paste.

(3) Comparative Examples 2 through 5

The above-prepared dielectric powder (100 parts by weight), methyl ethyl ketone (70 parts by weight) and zirconia grinding balls having a diameter of 1 mm (600 parts by weight) were placed in a ball mill, and wet-mixed for 16 hours. Subsequently, terpineol having a boiling point of 220° C. and a relative evaporation rate of 10 or less (40 parts by weight) and an organic binder (10 parts by weight) were added to the ball mill, and the resultant mixture was further mixed for 16 hours, to thereby obtain a ceramic slurry mixture.

As shown in Table 1, only one organic binder was employed in each of Comparative Examples 2 through 5.

Subsequently, the above-obtained ceramic slurry mixture was subjected to reduced-pressure distillation in a hot bath at 60° C. by use of an evaporator for two hours. Through distillation, methyl ethyl ketone was completely removed from the slurry to thereby obtain a ceramic paste.

5. Production of Monolithic Ceramic Capacitor

The conductive paste was applied onto a main surface of the above-formed ceramic green sheet through screen printing, and then dried at 80° C. for 10 minutes to thereby form internal electrodes. The size, shape and position of the internal electrodes were determined so as to fit a laminate chip produced in the below-described step. Subsequently, the ceramic paste of one of Working Examples 1 through 19 and Comparative Examples 1 through 5 was applied onto the main surface of the ceramic green sheet through screen printing, and then dried at 80° C. for 10 minutes to thereby form a ceramic green layer which compensates for spaces defined by step-like sections. The thicknesses of the internal electrode and the ceramic green layer were 1 μm after drying and 0.5 μm after firing.

Subsequently, the ceramic green sheets containing the internal electrodes and the ceramic green layer (200 sheets) were laminated, and then the lamination product was sandwiched by tens of ceramic green sheets not containing internal electrodes to thereby form a green laminate. The green laminate was thermally pressed at 80° C. under a pressure of 1,000 Kg/cm$^2$.

Subsequently, the resultant laminate was cut into a plurality of laminate chips by use of a cutting blade. The dimensions of each of the chips were determined so as to attain dimensions of 3.2 mm (length)×1.6 mm (width)×1.6 mm (thickness) after firing.

Subsequently, the above-obtained laminate chips were arranged on a firing setter on which a small amount of zirconia powder had been distributed, and the temperature of the chips was elevated from room temperature to 250° C. over 24 hours to thereby remove the organic binder. Then, the resultant chips were placed in a firing furnace, and the chips were fired with a temperature profile having a maximum temperature of 1,300° C. for about 20 hours.

Next, each of the resultant sintered chips was placed in a barrel and the side surfaces of the chip were subjected to polishing. Thereafter, external electrodes were formed on the opposite sides of the sintered chip to thereby produce a monolithic ceramic capacitor as a sample.

6. Evaluation of Characteristics

The ceramic paste and the monolithic ceramic capacitor of each of Working Examples 1 through 19 and Comparative Examples 1 through 5 were evaluated in terms a variety of characteristics. The results are shown in Table 1.

TABLE 1

| Organic binder (wt. %) | Working Example 1 | Working Example 2 | Working Example 3 | Working Example 4 | Working Example 5 | Working Example 6 | Working Example 7 |
| --- | --- | --- | --- | --- | --- | --- | --- |
| Polyvinyl butyral | 95 | 90 | 50 | 10 | 5 | — | — |
| Cellulose ester | 5 | 10 | 50 | 90 | 95 | 95 | 90 |
| Polyacrylate | — | — | — | — | — | 5 | 10 |
| Polyvinyl acetate | — | — | — | — | — | — | — |
| Dispersion degree | −0.3 | −0.2 | −0.2 | −0.2 | −0.3 | −0.3 | −0.2 |
| Thickness of printed film (μm) | 3 | 2 | 2 | 2 | 3 | 2 | 3 |
| Ra (μm) | 0.3 | 0.2 | 0.2 | 0.2 | 0.3 | 0.3 | 0.2 |
| Screen printability | Δ | ○ | ○ | ○ | ○ | ○ | ○ |
| Sheet adhesion | ○ | ○ | ○ | ○ | Δ | Δ | ○ |
| Ratio of structural defects (%) | 3 | 1 | 1 | 1 | 2 | 2 | 1 |

|  | Working Example 8 | Working Example 9 | Working Example 10 | Working Example 11 | Working Example 12 | Working Example 13 | Working Example 14 |
| --- | --- | --- | --- | --- | --- | --- | --- |
| Polyvinyl butyral | — | — | — | 5 | 10 | 50 | 90 |
| Cellulose ester | 5 | 10 | 5 | — | — | — | — |
| Polyacrylate | 50 | 90 | 95 | — | — | — | — |
| Polyvinyl acetate | — | — | — | 95 | 90 | 50 | 10 |
| Dispersion degree | −0.2 | −0.2 | −0.2 | −0.2 | −0.2 | −0.2 | −0.2 |
| Thickness of printed film (μm) | 3 | 2 | 3 | 3 | 3 | 3 | 3 |
| Ra (μm) | 0.3 | 0.3 | 0.3 | 0.3 | 0.3 | 0.3 | 0.3 |
| Screen printability | ○ | ○ | Δ | Δ | ○ | ○ | ○ |
| Sheet adhesion | ○ | ○ | ○ | ○ | ○ | ○ | ○ |
| Ratio of structural defects (%) | 1 | 1 | 3 | 3 | 1 | 1 | 1 |

| Organic binder (wt. %) | Working Example 15 | Working Example 16 | Working Example 17 | Working Example 18 | Working Example 19 | Comparative Example 1 |
| --- | --- | --- | --- | --- | --- | --- |
| Polyvinyl butyral | 95 | 90 | 50 | 10 | 5 | — |
| Cellulose ester | — | — | — | — | — | 100 |
| Polyacrylate | 5 | 10 | 50 | 90 | 95 | — |
| Polyvinyl acetate | — | — | — | — | — | — |
| Dispersion degree | −0.2 | −0.2 | −0.2 | −0.2 | −0.2 | 0 |
| Thickness of printed film (μm) | 3 | 2 | 3 | 3 | 3 | 3 |
| Ra (μm) | 0.3 | 0.3 | 0.3 | 0.3 | 0.3 | 1.5 |
| Screen printability | Δ | ○ | ○ | ○ | Δ | ○ |
| Sheet adhesion | ○ | ○ | ○ | ○ | ○ | X |
| Ratio of structural defects (%) | 3 | 1 | 1 | 1 | 3 | 80 |

TABLE 1-continued

| Organic binder (wt. %) | Comparative Example 2 | Comparative Example 3 | Comparative Example 4 | Comparative Example 5 |
|---|---|---|---|---|
| Polyvinyl butyral | 100 | — | — | — |
| Cellulose ester | — | 100 | — | — |
| Polyacrylate | — | — | 100 | — |
| Polyvinyl acetate | — | — | — | 100 |
| Dispersion degree | −0.2 | −0.2 | −0.2 | −0.2 |
| Thickness of printed film ($\mu$m) | 2 | 2 | 2 | 2 |
| Ra ($\mu$m) | 0.3 | 0.3 | 0.3 | 0.3 |
| Screen printability | Δ | ◯ | Δ | Δ |
| Sheet adhesion | ◯ | X | ◯ | ◯ |
| Ratio of structural defects (%) | 3 | 1 | 2 | 3 |

The characteristics shown in Table 1 were evaluated as follows.

Dispersion degree: the particle size distribution of the ceramic powder was measured by use of a light diffraction particle size distribution measuring apparatus, and the degree of dispersion of the powder was calculated on the basis of the resultant data. Briefly, the above-prepared ceramic powder was dispersed in water by use of an ultrasonic homogenizer and the particles were subjected to ultrasonic waves until they were reduced to their minimum size. When the particles reached their minimum size, the particle size at D90 of the particle size distribution was recorded as "limitation particle size." Separately, the ceramic paste was diluted with ethanol, and the particle size at D90 of the particle size distribution was recorded as "paste particle size." The dispersion degree of the ceramic powder was calculated on the basis of the following formula:

dispersion degree=(paste particle size/limitation particle size)−1.

When the dispersion degree has a positive value, the dispersibility of the powder is high when the value is nearer to zero. In contrast, when the dispersion degree has a negative value, the larger the absolute value, the higher the dispersibility of the powder.

Thickness of printed film: the ceramic paste was applied onto a 96% alumina substrate so as to attain a thickness of 20 $\mu$m by use of a 400-mesh stainless steel screen having a thickness of 50 $\mu$m, and the resultant substrate was dried at 80° C. for 10 minutes to thereby form a printed film for evaluation. The thickness of the film was obtained from data measured by a non-contact-type laser surface roughness meter.

Surface roughness (Ra): a printed film for evaluation was formed in a manner similar to that described above. The surface roughness (Ra) of the film, i.e., the averaged absolute value of deviation of a undulation-averaged center line and a roughness curve, was obtained from the data obtained by a non-contact-type laser surface roughness meter.

Screen printability: during screen printing, when it was possible to readily peel off the ceramic paste from a screen and the paste was able to be continuously printed without problems, the rating "◯" was assigned; when the paste could not be printed continuously, the rating "X" was assigned; and when the paste could be printed but was characterized by additional problems, the rating "Δ" was assigned.

Sheet adhesion: sheets formed from the ceramic paste were laminated and then pressed at 80° C. at pressures up to 1,000 Kg/cm² (the maximum). The pressure at which the sheets adhered to one another was determined. When the pressure was less than 300 Kg/cm², the rating "◯" was assigned; when the pressure was 300 Kg/cm² or more but less than 700 Kg/cm², the rating "Δ" was assigned; and when the pressure was 700 Kg/cm² or more, the rating "X" was assigned.

Ratio of structural defects: the resultant sintered chip for producing a monolithic ceramic capacitor was observed by appearance and under an ultrasonic microscope. When some unusual portions were observed, the presence of internal structural defects of the chip was confirmed after the chip had been polished. The ratio of structural defects was obtained on the basis of the following relation: the number of sintered chips having structural defects/the total number of sintered chips.

As is apparent from Table 1, the ceramic pastes and the capacitors of Working Examples 1 through 19 exhibit excellent characteristics as compared with the ceramic pastes and the capacitors of Comparative Examples 1 through 5.

Comparison among Working Examples 1 through 19 reveals that the ceramic pastes and the capacitors of Working Examples 2 through 4, 7 through 9, 12 through 14, and 16 through 18—in which the mixing ratios of two different binders contained in the pastes fall within about 10 wt. %/90 wt. % to 90 wt. %/10 wt. %—exhibit excellent characteristics, as compared with the ceramic pastes and the capacitors of Working Examples 1, 5, 6, 10, 11, 15 and 19, in which the mixing ratios of two different binders contained in the pastes fall outside the above range.

The ceramic pastes and the capacitors of Comparative Examples 2 through 5 exhibit excellent characteristics as compared with the ceramic paste and the capacitor of Comparative Example 1. However, comparison between the paste of Comparative Example 2, which contains polyvinyl butyral, and the pastes of Working Examples 1 through 3 and 13 through 17, which contain polyvinyl butyral as a primary component (i.e., 50 wt. % or more); comparison between the paste of Comparative Example 3, which contains a cellulose ester, and the pastes of Working Examples 3 through 8, which contain a cellulose ester as a primary component (i.e., 50 wt. % or more); comparison between the paste of Comparative Example 4, which contains an acrylate, and the pastes of Working Examples 8 through 10 and 17 through 19, which contain an acrylate as a primary component (i.e., 50 wt. % or more); and comparison between the paste of Comparative Example 5, which contains polyvinyl acetate, and the pastes of Working Examples 11 through 13, which contain polyvinyl acetate as a primary component (i.e., 50 wt. % or more) reveal that the ceramic pastes of Comparative Examples 2 through 5 still have room for improvement in dispersibility, thickness of printed film, surface roughness, screen printability, sheet adhesion or ratio of structural defects, as compared with the pastes of Working Examples 1 through 19, particularly the pastes of Working Examples 2 through 4, 7 through 9, 12 through 14, and 16 through 18.

Test Example 2

In Test Example 2, when a ceramic paste for forming a ceramic green layer which compensates for spaces defined by step-like sections was prepared, an organic binder employed in the paste was a copolymer predominantly containing an alkyl acrylate and/or an alkyl methacrylate. In Test Example 2, the effect of such a copolymer was confirmed.

The procedure of Test Example 1 was repeated, except that the step of "4. preparation of ceramic paste for forming a ceramic green layer which compensates for spaces defined by step-like sections" was carried out as described below, to thereby produce monolithic ceramic capacitors.

(1) Working Examples 20 through 25

The above-prepared dielectric powder (100 parts by weight), terpineol having a boiling point of 220° C. (40 parts by weight) and an organic binder (5 parts by weight) were mixed in an automatic mortar, and the resultant mixture was kneaded by use of a three-roll mill to thereby obtain a ceramic paste.

The organic binder contained an alkyl (meth)acrylate monomer serving as a primary component, and a reactive monomer having a carboxyl group, an alkylene oxide group $(RO)_n$, a hydroxyl group, a glycidyl group, an amino group or an amido group, serving as a copolymerization component.

Specifically, as shown in Table 2, in each of Working Examples 20 through 25, isobutyl methacrylate was employed as the alkyl (meth)acrylate monomer and was contained in the respective organic binder in an amount of 90 mol %. As shown in Table 2, different reactive monomers were contained in the respective organic binders in an amount of 10 mol % in Working Examples 20 through 25.

The aforementioned reactive monomers will be described in more detail. As shown in Table 2, acrylic acid was employed as a carboxylic acid-containing monomer in Working Example 20; ethylene oxide methacrylate was employed as an alkylene oxide group-containing alkyl (meth)acrylate in Working Example 21; 2-hydroxyethyl methacrylate was employed as a hydroxyl group-containing alkyl (meth)acrylate in Working Example 22; glycidyl methacrylate was employed as a glycidyl group-containing alkyl (meth)acrylate in Working Example 23; dimethylaminoethyl methacrylate was employed as an amino group-containing alkyl (meth)acrylate in Working Example 24; and N-methylolacrylamide was employed as an amido group-containing alkyl (meth)acrylate in Working Example 25.

(2) Working Examples 26 through 31

The above-prepared dielectric powder (100 parts by weight), methyl ethyl ketone (70 parts by weight) and zirconia grinding balls having a diameter of 1 mm (600 parts by weight) were placed in a ball mill and wet-mixed for 16 hours. Subsequently, terpineol having a boiling point of 220° C. (40 parts by weight) and an organic binder (10 parts by weight) were added to the ball mill, and the resultant mixture was further mixed for 16 hours to thereby obtain a ceramic slurry mixture.

As shown in Table 2, the organic binder employed in Working Example 26 was the same as that employed in Working Example 20; the organic binder employed in Working Example 27 was the same as that employed in Working Example 21; the organic binder employed in Working Example 28 was the same as that employed in Working Example 22; the organic binder employed in Working Example 29 was the same as that employed in Working Example 23; the organic binder employed in Working Example 30 was the same as that employed in Working Example 24; and the organic binder employed in Working Example 31 was the same as that employed in Working Example 25.

Subsequently, the above-obtained ceramic slurry mixture was subjected to reduced-pressure distillation in a hot bath at 60° C. by use of an evaporator for two hours. Through distillation, methyl ethyl ketone was completely removed from the slurry to thereby obtain a ceramic paste.

The ceramic paste and the monolithic ceramic capacitor of each of Working Examples 20 through 31 were evaluated for a variety of characteristics. The results are shown in Table 2.

TABLE 2

| Organic binder (mol %) | Working Example 20 | Working Example 21 | Working Example 22 | Working Example 23 | Working Example 24 | Working Example 25 |
| --- | --- | --- | --- | --- | --- | --- |
| Isobutyl methacrylate | 90 | 90 | 90 | 90 | 90 | 90 |
| Acrylic acid | 10 | — | — | — | — | — |
| Ethylene oxide methacrylate | 10 | — | — | — | — | — |
| 2-Hydroxyethyl methacrylate | — | — | 10 | — | — | — |
| Glycidyl methacrylate | — | — | — | 10 | — | — |
| Dimethylaminoethyl methacrylate | — | — | — | — | 10 | — |
| N-Methylolacrylamide | — | — | — | — | — | 10 |
| Dispersion degree | 0 | 0 | 0 | 0.1 | 0.1 | 0.1 |
| Thickness of printed film ($\mu$m) | 2 | 2 | 3 | 3 | 3 | 3 |
| Ra ($\mu$m) | 1.3 | 1.3 | 1.3 | 1.5 | 1.5 | 1.5 |
| Screen printability | ◯ | ◯ | ◯ | ◯ | ◯ | ◯ |
| Sheet adhesion | ◯ | ◯ | ◯ | ◯ | ◯ | ◯ |
| Ratio of structural defects (%) | 30 | 30 | 30 | 35 | 35 | 35 |

TABLE 2-continued

|  | Working Example 26 | Working Example 27 | Working Example 28 | Working Example 29 | Working Example 30 | Working Example 31 |
|---|---|---|---|---|---|---|
| Isobutyl methacrylate | 90 | 90 | 90 | 90 | 90 | 90 |
| Acrylic acid | 10 | — | — | — | — | — |
| Ethylene oxide methacrylate | — | 10 | — | — | — | — |
| 2-Hydroxyethyl methacrylate | — | — | 10 | — | — | — |
| Glycidyl methacrylate | — | — | — | 10 | — | — |
| Dimethyl amino ethyl methacrylate | — | — | — | — | 10 | — |
| N-Methylolacrylamide | — | — | — | — | — | 10 |
| Dispersion degree | −0.3 | −0.3 | −0.3 | −0.2 | −0.2 | −0.2 |
| Thickness of printed film ($\mu$m) | 2 | 2 | 3 | 3 | 3 | 3 |
| Ra ($\mu$m) | 0.4 | 0.4 | 0.4 | 0.5 | 0.5 | .05 |
| Screen printability | ◯ | ◯ | ◯ | ◯ | ◯ | ◯ |
| Sheet adhesion | ◯ | ◯ | ◯ | ◯ | ◯ | ◯ |
| Ratio of structural defects (%) | 1 | 1 | 1 | 2 | 2 | 2 |

The methods for evaluating the characteristics shown in Table 2 are similar to those employed for the items in Table 1.

As is apparent from Table 2, the ceramic pastes and the capacitors of Working Examples 20 through 31 exhibit excellent characteristics as compared with the ceramic paste and the capacitor of Comparative Example 1 shown in Table 1.

Comparison among Working Examples 20 through 31 reveals that the ceramic pastes and the capacitors of Working Examples 26 through 31 exhibit excellent characteristics in terms of dispersibility, surface roughness and ratio of structural defects, as compared with the ceramic pastes and the capacitors of Working Examples 20 through 25. This is because when the ceramic pastes were produced in Working Examples 26 through 31, the first and second dispersion steps were carried out and the organic binder was added during the second dispersion step.

In the above-described Test Examples, dielectric ceramic powder is incorporated into the ceramic paste of the present invention. However, in the present invention, the characteristics of the ceramic paste are not influenced by electric characteristics of the ceramic powder contained in the paste. Therefore, the ceramic paste containing magnetic ceramic powder, insulating ceramic powder or piezoelectric ceramic powder exhibits characteristics similar to those of the ceramic paste containing dielectric ceramic powder.

As described hereinabove, according to the present invention, the ceramic paste contains as an organic binder, a mixture formed by physically mixing two different organic binders, such as a mixture of polyvinyl butyral and a cellulose ester, a mixture of a polyacrylate and a cellulose ester, a mixture of polyvinyl butyral and polyvinyl acetate or a mixture of polyvinyl butyral and a polyacrylate. Alternatively, the ceramic paste contains as an organic binder, a copolymer predominantly containing an alkyl acrylate and/or an alkyl methacrylate. Therefore, dispersibility of ceramic powder contained in the ceramic paste can be enhanced and thus the paste is advantageously employed for forming a very thin ceramic green layer at high pattern accuracy.

According to the present invention, since a ceramic paste is employed for forming a ceramic green layer on the region of the main surface of a ceramic green sheet on which internal circuit element films are not formed, so as to substantially compensate for spaces defined by the step-like sections formed by the films, the resultant monolithic ceramic electronic component does not suffer structural defects such as cracking and delamination, and exhibits high reliability.

According to the present invention, the size and weight of a monolithic ceramic electronic component can be satisfactorily reduced. Therefore, when the present invention is applied to a monolithic ceramic capacitor, the size of the capacitor can be advantageously reduced and the capacitance thereof can be advantageously increased. In addition, when the present invention is applied to a monolithic inductor, the size of the inductor can be advantageously reduced and the inductance thereof can be advantageously increased.

In the present invention, a ceramic paste is produced through the following steps: a first dispersion step in which a first mixture containing ceramic powder and a first organic solvent undergoes processing for providing a primary dispersion; a second dispersion step in which a second mixture containing an organic binder and the first mixture which has undergone the first dispersion step undergoes processing for providing a secondary dispersion; a step in which a second organic solvent having a relative evaporation rate lower than that of the first organic solvent is added to the first mixture and/or the second mixture; and a step for selectively removing the first organic solvent from the second mixture through heating the second mixture. Consequently, dispersibility of the ceramic powder contained in the ceramic paste can be further enhanced.

In the process for producing a monolithic ceramic electronic component of the present invention, a ceramic green sheet and a ceramic green layer which compensates for spaces defined by step-like sections can be uniformly sintered when ceramic powder contained in a ceramic slurry for forming the ceramic green sheet has a composition substantially the same as that of ceramic powder contained in a ceramic paste for forming the ceramic green layer. When the ceramic green sheet and the ceramic green layer are uniformly sintered, cracking or delamination can be prevented.

What is claimed is:

1. A process for producing a monolithic ceramic electronic component, which comprises:
    forming a composite structure by shaping the ceramic slurry into a ceramic green sheet having a main surface, applying a conductive paste onto a portion of the main surface of the ceramic green sheet so as to provide step-like section of an internal circuit element film, and applying a ceramic paste onto the region on the main surface of the sheet on which the element film has not been formed so as to form a ceramic green layer which substantially compensates for the spaces defined by the step-like section;

forming a green laminate by laminating a plurality of the composite structures; and firing the green laminate, wherein the ceramic paste comprises ceramic powder, an organic solvent and an organic binder, and wherein the organic binder comprises a member selected from the group consisting of (a) a mixture of polyvinyl butyral and cellulose ester, (b) a mixture of a polyacrylate and a cellulose ester, (c) a mixture of polyvinyl butyral and polyvinyl acetate and (d) a mixture of polyvinyl butyral and a polyacrylate, and wherein the binder mixtures are at a weight ratio of about 10:90 to 90:10.

2. A process for producing a monolithic ceramic electronic component according to claim 1, wherein the binder comprises a mixture of polyvinyl butyral and cellulose ester.

3. A process for producing a monolithic ceramic electronic component according to claim 1, wherein the binder comprises a mixture of a polyacrylate and a cellulose ester.

4. A process for producing a monolithic ceramic electronic component according to claim 1, wherein the binder comprises a mixture of polyvinyl butyral and polyvinyl acetate.

5. A process for producing a monolithic ceramic electronic component according to claim 1, wherein the binder comprises a mixture of polyvinyl butyral and a polyacrylate.

6. A process for producing a monolithic ceramic electronic which comprises:

forming a composite structure by shaping the ceramic slurry into a ceramic green sheet having a main surface, applying a conductive paste onto a portion of the main surface of the ceramic green sheet so as to provide step-like section of an internal circuit element film, and applying a ceramic paste onto the region on the main surface of the sheet on which the element film has not been formed so as to form a ceramic green layer which substantially compensates for the spaces defined by the step-like section;

forming a green laminate by laminating a plurality of the composite structures; and firing the green laminate, wherein the ceramic paste comprises ceramic powder, an organic solvent and an organic binder, and wherein the organic binder comprises a copolymer of alkyl (meth) acrylate and a reactive monomer having a carboxyl group, an alkylene oxide group, a hydroxyl group, a glycidyl group, an amino group or an amido group.

7. A process for producing a monolithic ceramic electronic component according to claim 1, further comprising preparing the ceramic paste by dispersing a first mixture comprising ceramic powder and a first organic solvent in the absence of organic binder to provide a primary dispersion;

dispersing a second mixture comprising organic binder and the primary dispersion to provide a secondary dispersion; and removing the first organic solvent from the secondary dispersion by heating the secondary dispersion, wherein a second organic solvent having a relative evaporation rate lower than that of the first organic solvent is incorporated into the first mixture or the second mixture or both.

8. A process for producing a monolithic ceramic electronic component according to claim 7, wherein the ceramic slurry and the ceramic past each contain a ceramic powder of substantially the same composition; the amount of binder is about 1 to 20 wt. % based on the ceramic; the first organic solvent has a relative evaporation rate of at least 100; and the second organic solvent has a relative evaporation rate of less than about 50 and a boiling point of at least about 150° C.

9. A process for producing a monolithic ceramic electronic component according to claim 1, wherein the ceramic slurry and the ceramic paste each contain a ceramic powder of substantially the same composition.

10. A process for producing a monolithic ceramic electronic component according to claim 1, wherein the ceramic slurry and the ceramic paste each contain a dielectric ceramic powder.

11. A process for producing a monolithic ceramic electronic component according to claim 10, wherein the internal circuit element films are disposed so as to form internal electrodes arranged to provide capacitance between pairs thereof, and the monolithic ceramic electronic component is a monolithic ceramic capacitor.

12. A process for producing a monolithic ceramic electronic component according to claim 1, wherein the ceramic slurry and the ceramic paste each contain a magnetic ceramic powder.

13. A process for producing a monolithic ceramic electronic component according to claim 12, wherein the internal circuit element films are curved conductive films disposed so as to form a monolithic inductor when the green laminate is fired.

14. A process for producing a monolithic ceramic electronic component according to claim 6, further comprising preparing the ceramic paste by dispersing a first mixture comprising ceramic powder and a first organic solvent in the absence of organic binder to provide a primary dispersion;

dispersing a second mixture comprising organic binder and the primary dispersion to provide a secondary dispersion; and removing the first organic solvent from the secondary dispersion by heating the secondary dispersion, wherein a second organic solvent having a relative evaporation rate lower than that of the first organic solvent is incorporated into the first mixture or the second mixture or both.

15. A process for producing a monolithic ceramic electronic component according to claim 14, wherein the ceramic slurry and the ceramic paste each contain a ceramic powder of substantially the same composition; the binder copolymer has a molecular weight of about 1,000 to 300,000 and contains at least about 50 mol % alkyl (meth) acrylate; the amount of binder is about 1 to 20 wt. % based on the ceramic; the first organic solvent has a relative evaporation rate of at least 100; and the second organic solvent has a relative evaporation rate of less than about 50 and a boiling point of at least about 150° C.

16. A process for producing a monolithic ceramic electronic component according to claim 15, wherein the binder copolymer has a molecular weight of about 10,000 to 100,000; the amount of binder is about 3 to 10 wt. % based on the ceramic; and the second organic solvent has a boiling point of about 200 to 250° C.

17. A process for producing a monolithic ceramic electronic component according to claim 6, wherein the ceramic slurry and the ceramic paste each contain a ceramic powder of substantially the same composition.

18. A process for producing a monolithic ceramic electronic component according to claim 6, wherein the ceramic slurry and the ceramic paste each contain a dielectric ceramic powder.

19. A process for producing a monolithic ceramic electronic component according to claim 18, wherein the internal circuit element films are disposed so as to form internal electrodes arranged to provide capacitance between pairs thereof, and the monolithic ceramic electronic component is a monolithic ceramic capacitor.

20. A process for producing a monolithic ceramic electronic component according to claim 6, wherein the ceramic slurry and the ceramic paste each contain a magnetic ceramic powder.

21. A process for producing a monolithic ceramic electronic component according to claim 20 wherein the internal circuit element films are curved conductive films disposed so as to form a monolithic inductor when the green laminate is fired.

* * * * *